United States Patent
Tu et al.

(10) Patent No.: US 8,563,350 B2
(45) Date of Patent: Oct. 22, 2013

(54) WAFER LEVEL IMAGE SENSOR PACKAGING STRUCTURE AND MANUFACTURING METHOD FOR THE SAME

(75) Inventors: Hsiu-Wen Tu, Hsin-Chu Hsien (TW); Han-Hsing Chen, Hsin-Chu Hsien (TW); Chung-Hsien Hsin, Hsin-Chu Hsien (TW); Ming-Hui Chen, Hsin-Chu Hsien (TW)

(73) Assignee: Kingpak Technology Inc., Chu-Pei, Hsin-Chu Hsien (TW)

( * ) Notice: Subject to any disclaimer, the term of this patent is extended or adjusted under 35 U.S.C. 154(b) by 285 days.

(21) Appl. No.: 12/947,316

(22) Filed: Nov. 16, 2010

(65) Prior Publication Data
US 2011/0291215 A1 Dec. 1, 2011

(30) Foreign Application Priority Data
May 31, 2010 (TW) .............................. 99117478 A

(51) Int. Cl.
*H01L 31/0203* (2006.01)
*H01L 21/00* (2006.01)

(52) U.S. Cl.
USPC 438/66; 257/432; 257/E31.001; 257/E31.117; 257/433; 438/65; 438/116

(58) Field of Classification Search
USPC .................. 257/430–440, 234, 741, E31.001, 257/E31.117
See application file for complete search history.

(56) References Cited

U.S. PATENT DOCUMENTS

| 2009/0045476 A1 | 2/2009 | Peng et al. |
| 2009/0068798 A1 * | 3/2009 | Oliver et al. .................. 438/127 |
| 2009/0243051 A1 | 10/2009 | Vanam et al. |
| 2010/0006966 A1 | 1/2010 | Tsai et al. |

FOREIGN PATENT DOCUMENTS

| EP | 0 813 236 A1 | 12/1997 |
| EP | 2 388 821 A1 | 11/2011 |
| WO | WO 2006/101270 A1 | 9/2006 |
| WO | WO 2009/158105 A2 | 12/2009 |
| WO | WO 2009/158414 A1 | 12/2009 |

OTHER PUBLICATIONS

European Search Report issued from the European Patent Office in the corresponding application No. EP 10 19 1979, mailed Sep. 13, 2011, 8 pages.

* cited by examiner

*Primary Examiner* — Mamadou Diallo
(74) *Attorney, Agent, or Firm* — Stites & Harbison PLLC; Juan Carlos A. Marquez, Esq.

(57) ABSTRACT

The present invention discloses a wafer level image sensor packaging structure and a manufacturing method for the same. The manufacturing method includes the following steps: providing a silicon wafer with image sensor chips, providing a plurality of transparent lids, allotting one said transparent lid on top of the corresponding image sensor chip, and carrying out a packaging process. The manufacturing method of the invention has the advantage of having a simpler process, lower cost, and higher production yield rate. The encapsulation compound arranges on the first surface of the image sensor chip and covers the circumference of the transparent lid to avoid the side light leakage as traditional chip scale package (CSP). Thus, the sensing performance of the wafer level image sensor packaging structure can be enhanced.

16 Claims, 13 Drawing Sheets

WAFER LEVEL IMAGE SENSOR PACKAGING STRUCTURE AND MANUFACTURING METHOD FOR THE SAME

BACKGROUND OF THE INVENTION

1. Technical Field

The present invention relates to a wafer level image sensor packaging structure and a manufacturing method for the same. More particularly, the present invention discloses a wafer level image sensor packaging structure applicable to image sensor packaging structures made through batch manufacture and a manufacturing method for such wafer level image sensor packaging structure.

2. Description of Related Art

In recent years, bright prospects for digital image sensors have been promised by the developing global popularization of digital image products and the increasing demand for camera phones, digital still cameras, digital video cameras, and various other digital image products.

Such digital image sensors, according to the manufacturing processes used, would be classified into two types, namely CCD (Charge-Coupled Device) and CMOS (Complementary Metal-Oxide-Semiconductor). While CCD is a mature technology that provides good image quality, the particular processing technique it involves requires higher costs. By comparison, CMOS technology is based on semiconductor chips and has the advantages of lower costs, simpler processes, resulting in more compact products, thus being especially suitable for applications where the dpi requirement is relatively compromised, such as camera phones. Therefore, CMOS and CCD are technologies that each has its market niche.

The traditional packaging approaches for image sensors include COB (Chip On Board) and CSP (Chip Scale Package). The COB process is accomplished by adhering an image sensor chip onto a substrate, electrically connecting the substrate and the image sensor chip by means of metal wires, and carrying out a packaging procedure to package the image sensor chip. Hence, the resultant image sensor packaging structure is relatively large in size and has a significant height. On the other hand, the CSP process is more suitable for image sensor chips of low resolution. In high-resolution applications, CSP is less competitive in cost and its inherent glass structure further adds the height of the image sensor module in addition to the necessary lens module, while being inferior to COB packaging in sensing performance. Furthermore, the traditional CSP structure has the problem of side light leakage, and thus requires the additional procedures for setting shadow masks or coating shading material on the sides of the packaging structure for preventing the degradation of sensory performance or avoiding the generation of flares.

SUMMARY OF THE INVENTION

The present invention provides a wafer level image sensor packaging structure and a manufacturing method for the same, wherein by adopting a TSV wafer as a silicon wafer, as compared with the traditional CSP process or COB process, the present invention dispenses with metal wires and any substrate so as to downsize the resultant image sensor packaging structure and reduce its height.

The present invention provides a wafer level image sensor packaging structure and a manufacturing method for the same, wherein an opaque encapsulation compound covering the circumference of the transparent lid helps to prevent side light leakage for the image sensor packaging structure without using any additional shadow mask or shading layer.

The present invention provides a wafer level image sensor packaging structure and a manufacturing method for the same, wherein the TSV wafer is adopted as the silicon wafer, so as to dispense with the use of any metal wire and substrate, and thus, as compared with the traditional process, the present invention saves materials and is suitable for mass manufacture which reduces costs, while the simplified manufacturing process improves the production yield rate.

To achieve the foregoing effects, the present invention provides a manufacturing method for a wafer level image sensor packaging structure, comprising steps of: providing a silicon wafer, which has a plurality of image sensor chips, wherein each said image sensor chip has a photosensitive area; providing a plurality of transparent lids; allotting one said transparent lid over the photosensitive area of a respective said image sensor chip; and carrying out a packaging process by arranging an encapsulation compound on a first surface of the silicon wafer so that the encapsulation compound covers the circumferences of the transparent lids.

To achieve the foregoing effects, the present invention also provides a wafer level image sensor packaging structure, comprising: an image sensor chip, which has a plurality of photosensitive elements set in a photosensitive area on a first surface of the image sensor chip, a plurality of first contacts set on the first surface to surround the exterior the photosensitive area and electrically connected to the photosensitive elements, a plurality of conducting channels passing through the chip with one end thereof electrically connected to the first contacts, and a plurality of solder ball pads set on a second surface of the image sensor chip and electrically connected to the conducting channel; a transparent lid, which is correspondingly set over the photosensitive area so that an air chamber is defined between the transparent lid and the image sensor chip; and an encapsulation compound, which is arranged on the first surface and covers a circumference of the transparent lid.

By implementing the present invention, at least the following progressive effects can be expected:

1. The manufacturing process is simpler than the traditional CSP process or COB process, and the resultant image sensor packaging structure is made compact with reduced assembly height, thereby meeting the trend of compactness for electronic devices.

2. The opaque encapsulation compound covering the circumference of the transparent lid helps to prevent side light leakage for the image sensor packaging structure.

3. Since the overall use of material consumed is economized, the manufacturing cost is significantly reduced and the production yield rate is improved.

BRIEF DESCRIPTION OF THE DRAWINGS

The invention as well as a preferred mode of use, further objectives and advantages thereof will be best understood by reference to the following detailed description of illustrative embodiments when acquired in conjunction with the accompanying drawings, wherein.

DETAILED DESCRIPTION OF THE INVENTION

Figure 1:
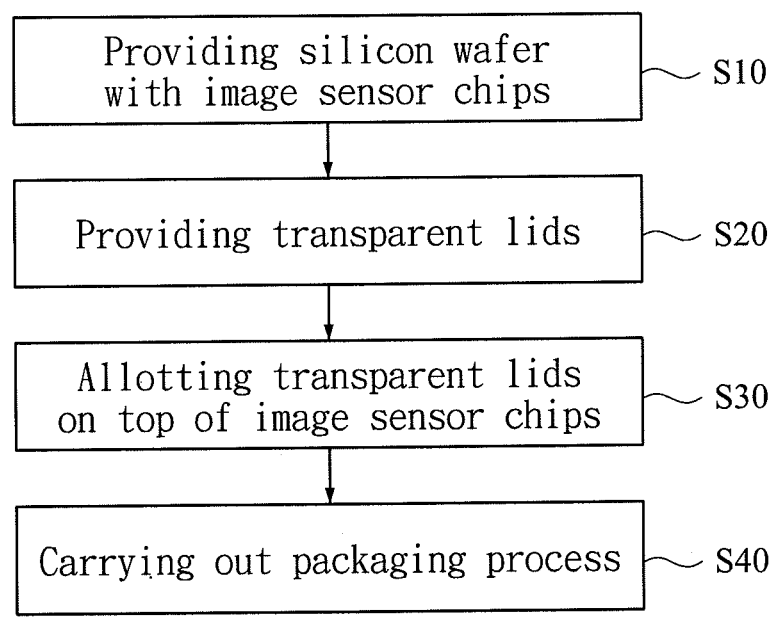
FIG. 1 is a flowchart showing a manufacturing method for a wafer level image sensor packaging structure according to one embodiment of the present invention.

As shown in FIG. 1, the present embodiment provides a manufacturing method for a wafer level image sensor package structure. The manufacturing method comprises the following steps: providing a silicon wafer with image sensor chips (S10); providing a plurality of transparent lids (S20); allotting one said transparent lid on top of the corresponding image sensor chip (S30); and carrying out a packaging process (S40).

Figure 2:
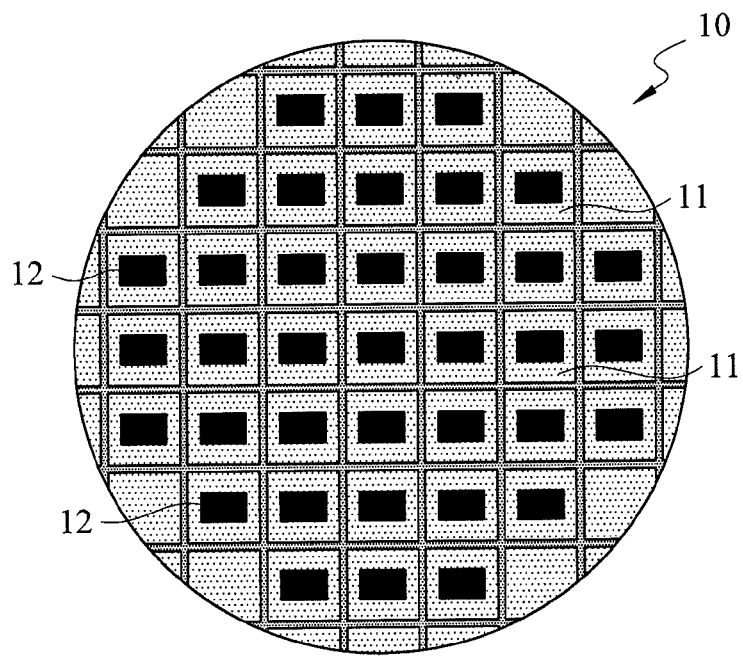
FIG. 2 is a schematic view of a silicon wafer with image sensor chips according to one embodiment of the present invention.

In the step of providing the silicon wafer (S10), as shown in FIG. 2, the silicon wafer 10 has a plurality of image sensor chips 11, and each said image sensor chip 11 has a photosensitive area 12.

Figure 12A:
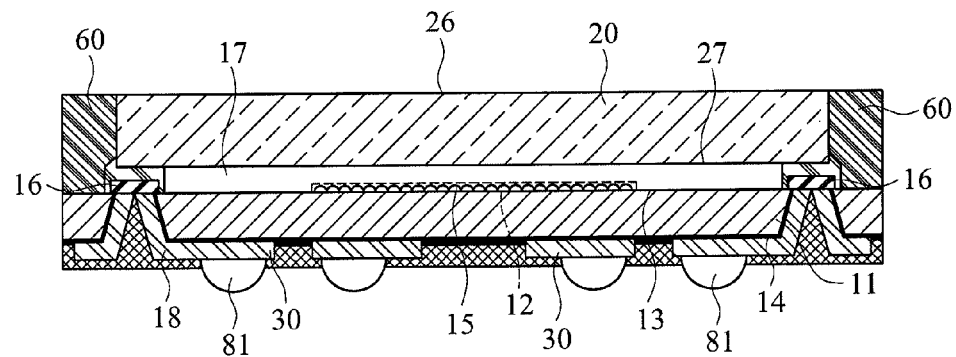
FIG. 12A through FIG. 14B respectively show an embodiment of the image sensor packaging structure of the present invention.

For further illustration, the silicon wafer 10 may be a TSV (Through-Silicon Vias) wafer. Referring to FIG. 12A in connection with FIG. 1, by dicing the TSV wafer, the TSV wafer is subdivided into a plurality of image sensor chips 11. Each said image sensor chip 11 has a first surface 13 and a second surface 14, wherein the first surface 13 and the second surface 14 are also the first surface 13 and the second surface 14 of the silicon wafer 10.

Referring to the sectional view of the TSV wafer as shown in FIG. 12A, the wafer is preformed with vias, and conducting channels 18 are provided in the vias, so as to electrically connect the conducting channel 18 with the first contacts 16 on the first surface 13 of the silicon wafer 10. The conducting channels 18 may be extended to the second surface 14.

In addition, a re-distribution layer (not shown) may be formed on the second surface 14. The re-distribution layer may be electrically connected to solder ball pads 30, which are also electrically connected to the conducting channel 18 and arranged as an LGA (Land Grid Array), so as to arrange intervals between the solder ball pads 30 by the re-distribution layer.

Figure 3:
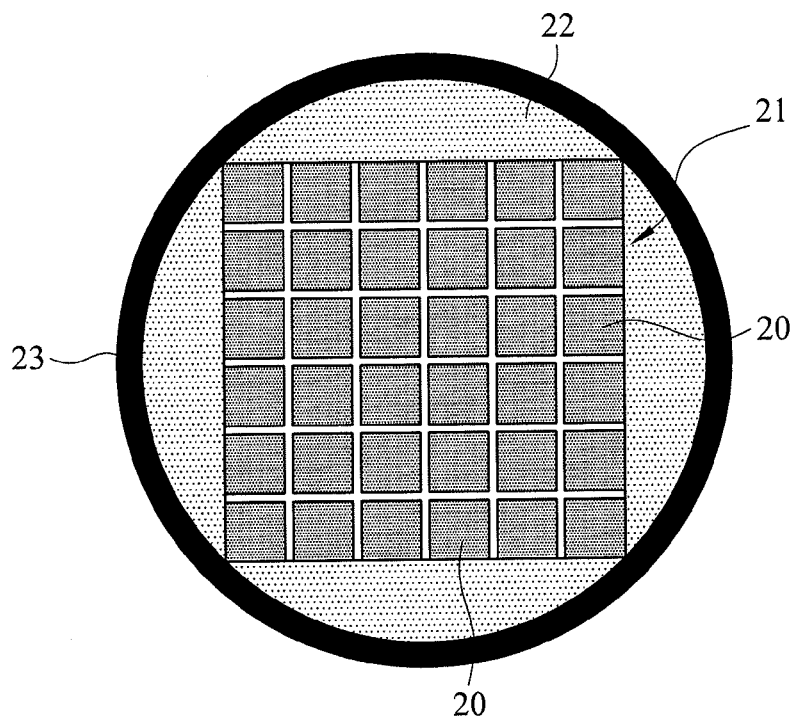
FIG. 3 is a schematic view of transparent lids according to one embodiment of the present invention.

In the step of providing the plurality of transparent lids (S20), as shown in FIG. 3, the transparent lids 20 may be formed by cutting a transparent panel 21 which is placed on a carrier film 22 on which a frame 23 is provided to surround edges of the transparent panel 21. The frame 23 facilitates the positioning of the transparent panel 21 during the cutting procedure.

Figure 4A:
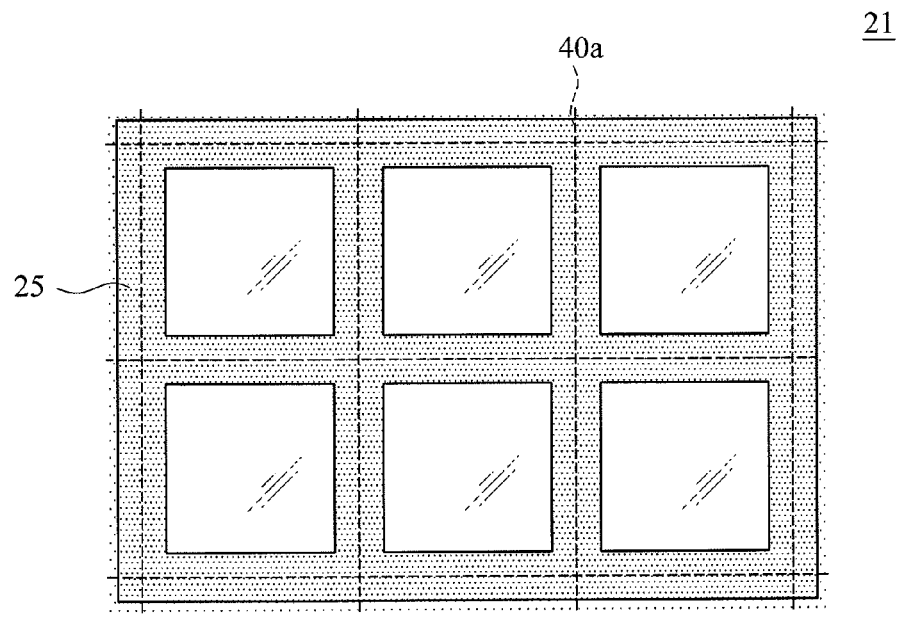
FIG. 4A is a top schematic view of transparent lids with bank-shaped frames according to one embodiment of the present invention.
Figure 4B:
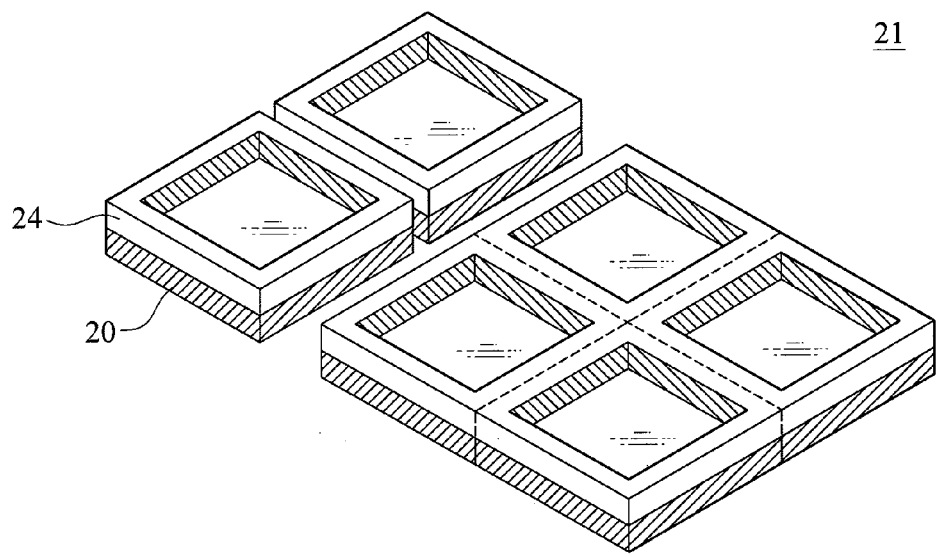
FIG. 4B is a perspective schematic view of the transparent lids with the bank-shaped frames.

Referring to FIG. 4A and FIG. 4B, before the cutting procedure, there may be further provided a plurality of bank-shaped frames 25 on the transparent panel 21. In the cutting procedure, the transparent panel 21 is cut along each cutting lines 40a on one of the bank-shaped frames 25, so that each of the separated transparent lids 20 has a supporting frame 24 edgewise (referring to FIG. 5B as well). In addition, the bank-shaped frame 25 may be formed through a screen printing process, a transfer molding process, or an injection molding process.

Figure 5A:
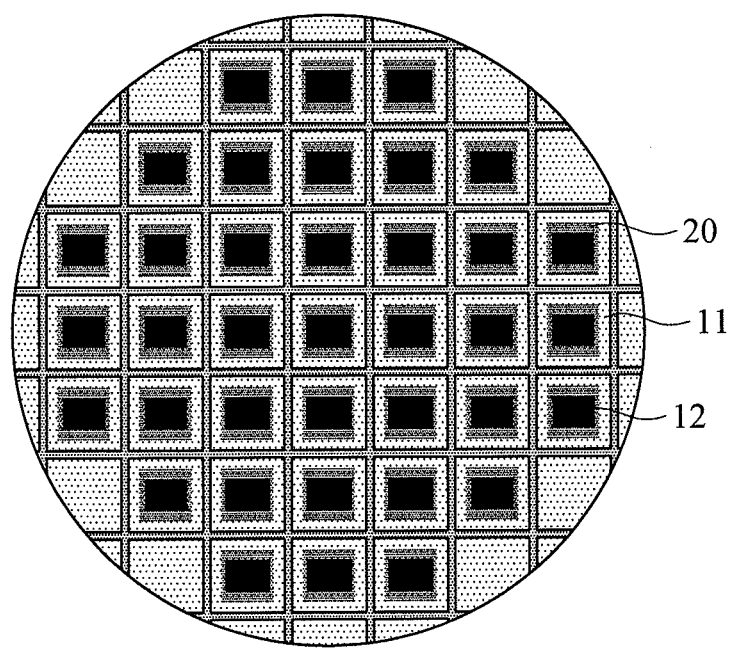
FIG. 5A is a top schematic view of a silicon wafer having the transparent lids according to the present invention.
Figure 5B:
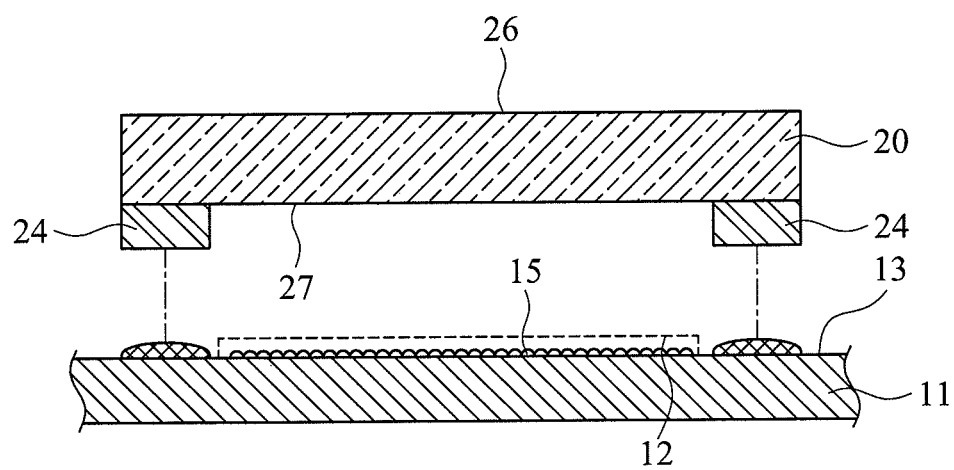
FIG. 5B is a schematic drawing showing the transparent lid correspondingly adhered to the image sensor chip according to the present invention.
Figure 13A:
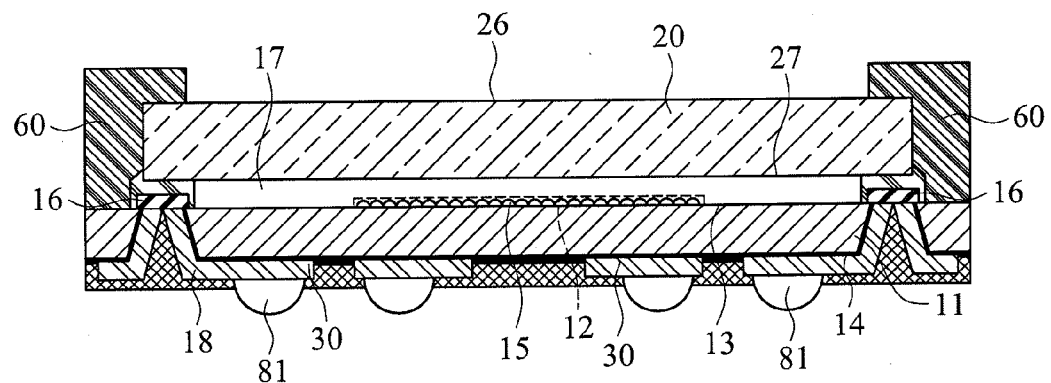
Figure 14A:
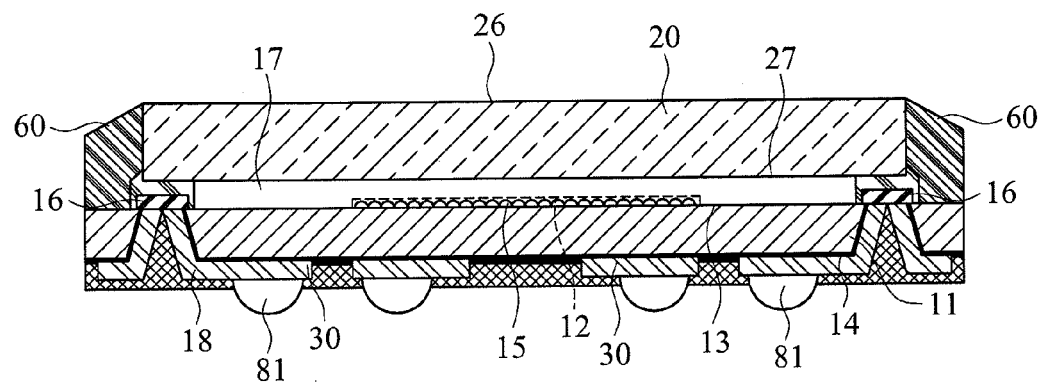

In the step of allotting one said transparent lid on top of the corresponding image sensor chip (S30), as shown in FIG. 5A and FIG. 5B, each said transparent lid 20 is correspondingly set on top of the photosensitive area 12 of the corresponding image sensor chip 11. Referring to FIG. 12A, FIG. 13A and FIG. 14A all together, the transparent lid 20 has a third surface 26 and a fourth surface 27, and the first surface 13 may be provided with an adhesive so that the adhesive corresponds to the edges of the fourth surface 27 and serves to adhere the transparent lid 20 to the image sensor chip 11 such that an air chamber 17 is defined over the photosensitive area 12 of the image sensor chip 11.

Referring to FIG. 5B, the transparent lid 20 with the supporting frame 24 is adhered to the image sensor chip 11 by the supporting frame 24 to make the photosensitive area 12 edgewise surrounded by the supporting frame 24.

Figure 7A:
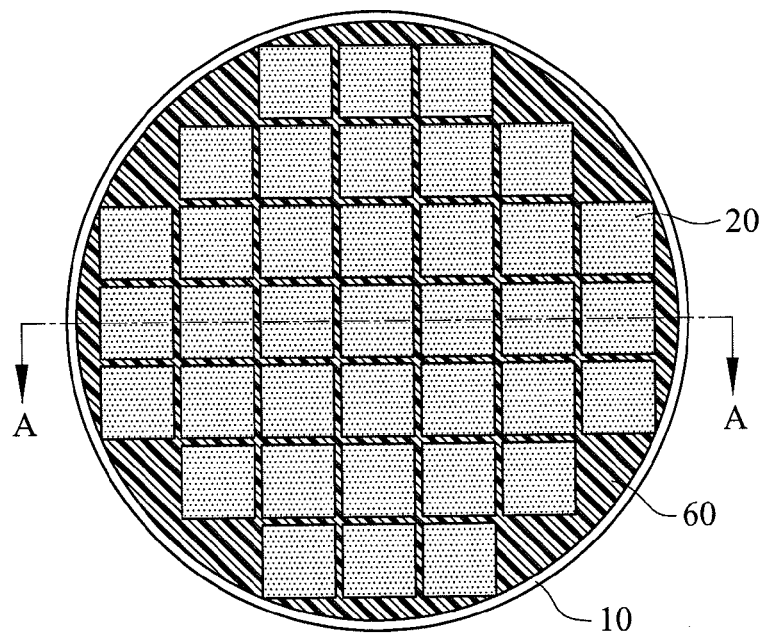
FIG. 7A is a top schematic view of a silicon wafer packaged by an encapsulation compound according to one embodiment of the present invention.
Figure 7B:
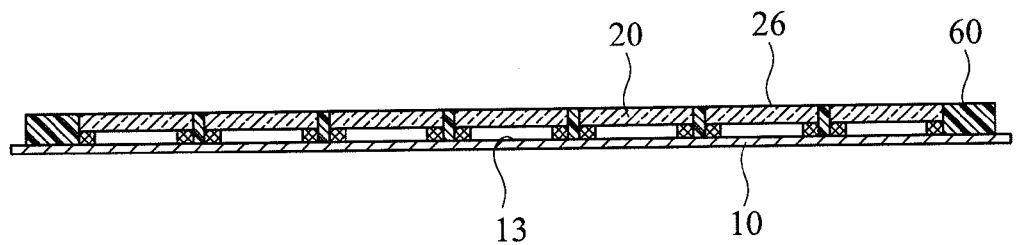
FIG. 7B is a sectional view of FIG. 7A taken along Line A-A.
Figure 8A:
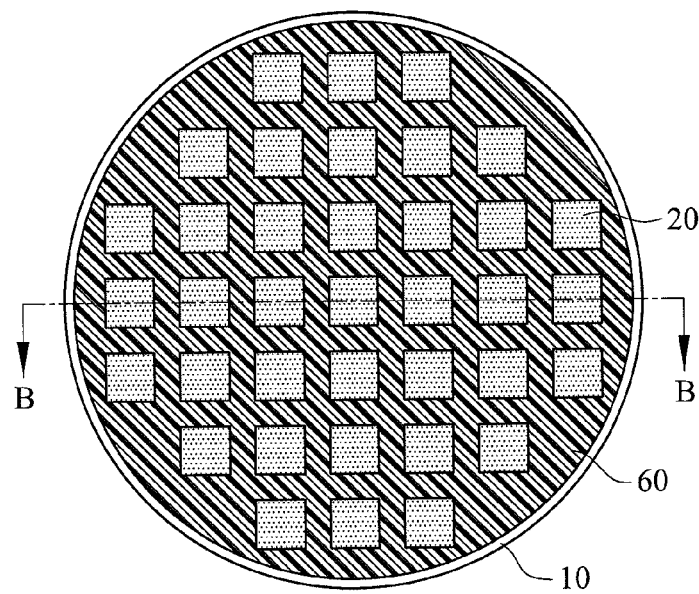
FIG. 8A is a top schematic view of a silicon wafer packaged by an encapsulation compound according to another embodiment of the present invention.
Figure 8B:
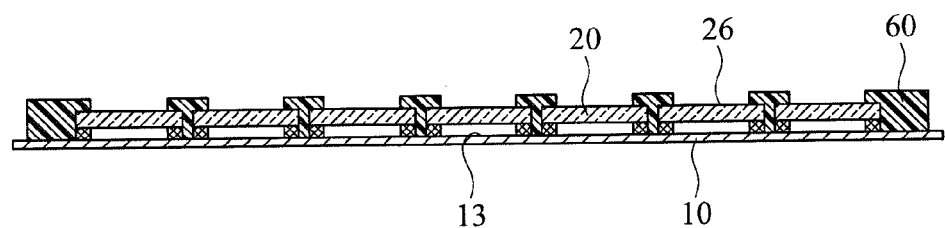
FIG. 8B is a sectional view of FIG. 8A taken along Line B-B.
Figure 10A:
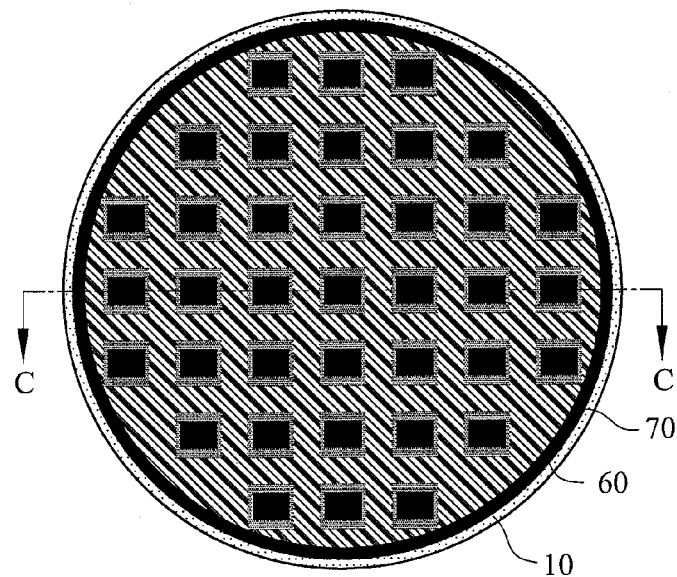
FIG. 10A is a top schematic view of a silicon wafer with dam and cured encapsulation compound according to the present invention.
Figure 10B:
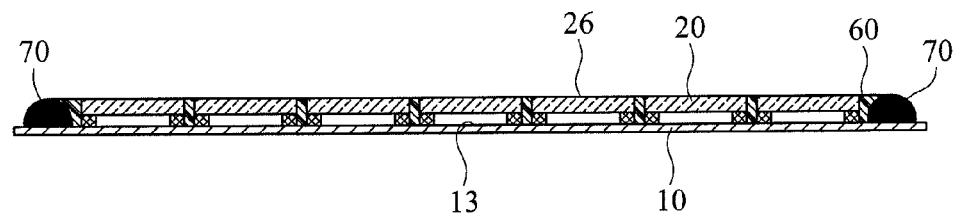
FIG. 10B is a sectional view of FIG. 10A taken along Line C-C.

In the step of carrying the packaging process (S40), as shown in FIG. 7B, FIG. 8B and FIG. 10B, an encapsulation compound 60 is deposited on the first surface 13 of the silicon wafer 10 to make the encapsulation compound 60 cover the circumference of the transparent lids 20. Since the encapsulation compound 60 may be of an opaque material, the image sensor packaging structure can avoid the side light leakage without the use of additional shadow masks or shading material.

Two different packaging processes are disclosed in the present embodiment, namely molding packaging process and dispensing packaging process.

The molding packaging process is first illustrated, wherein the encapsulation compound 60 used is a mold compound.

Figure 6A:
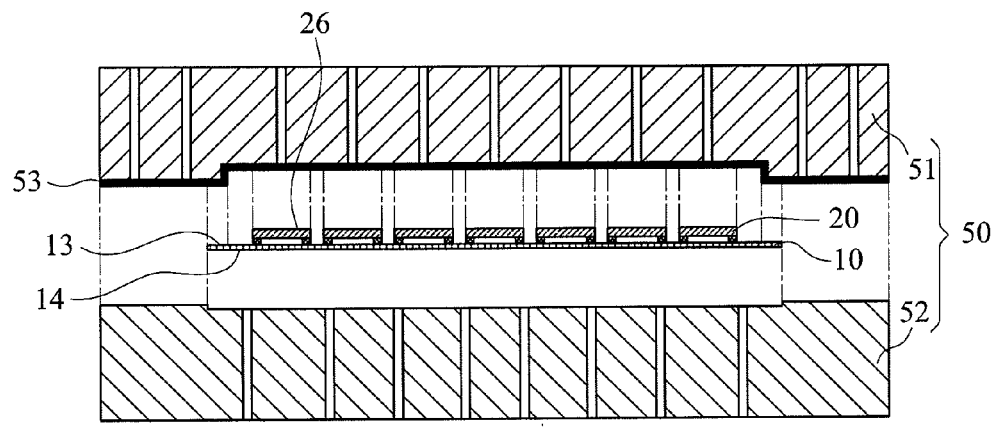
FIG. 6A is a schematic drawing showing a silicon wafer placed in a mold according to one embodiment of the present invention.
Figure 6B:
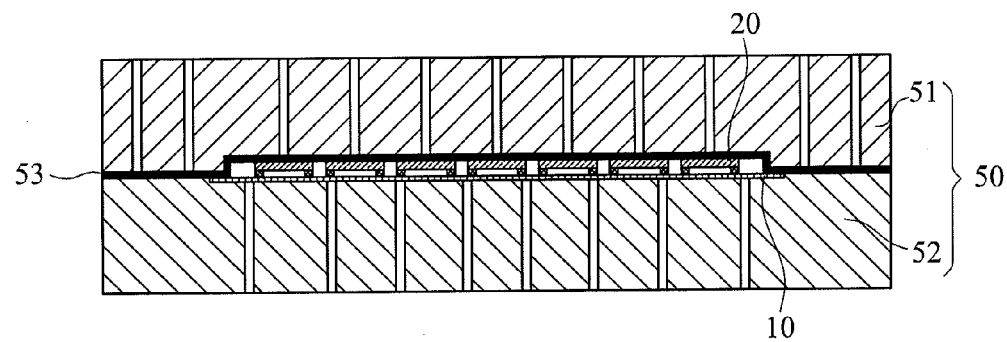
FIG. 6B is a sectional view of the mold and the silicon wafer placed therein according to FIG. 6A.

As shown in FIG. 6A and FIG. 6B, the silicon wafer 10 with the transparent lids 20 is placed in a mold 50. The mold 50 comprises an upper mold member 51 and a lower mold member 52. Therein, the upper mold member 51 is configured to abut against the third surfaces 26 of the transparent lids 20, and the lower mold member 52 is configured to carry the silicon wafer 10 while abutting against the second surface 14 of the silicon wafer 10.

Moreover, a vacuum absorbed buffer layer 53 may be provided on the inner surface of the upper mold member 51. The buffer layer 53 directly presses on the transparent lids 20 to prevent the third surfaces 26 of the transparent lids 20 from being contacted by the bleeding resin during injection of the encapsulation compound. It is therefore provided between the transparent lids 20 and the upper mold member 51 for abutting against the third surfaces 26 of the transparent lids 20 so as to prevent contamination caused by resin bleeding.

Figure 6C:
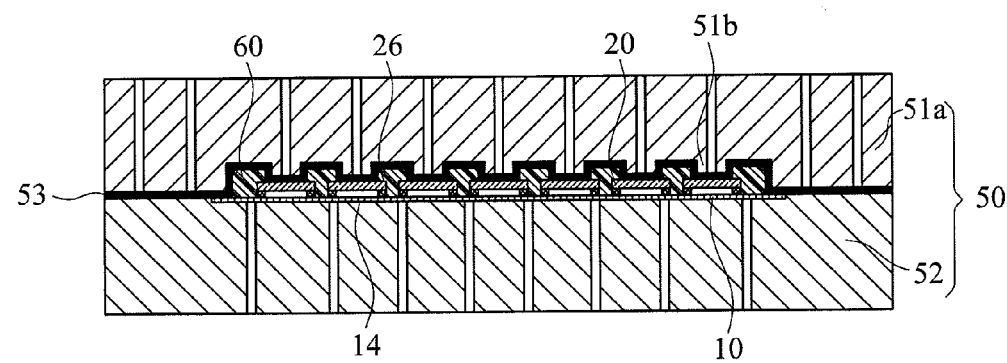
FIG. 6C is a sectional view of a mold and a silicon wafer placed therein according to another embodiment of the present invention.

As shown in FIG. 6C, for the encapsulation compound 60 to cover the circumference of the third surfaces 26 but not to cover the entire third surfaces 26, an alternative structure of the upper mold member indicated by the numeral 51a may be used. The upper mold member 51a has a plurality of bulges 51b each abutting against the center portion of the corresponding third surface 26. Meantime, there is also a vacuum absorbed buffer layer 53 provided between the upper mold member 51a and the transparent lids 20 for abutting against the third surfaces 26 and thereby preventing contamination caused by resin bleeding.

After the silicon wafer 10 with the transparent lids 20 is placed into the mold 50, the packaging process can be commenced. In the packaging process, vacuum is applied to make the upper mold member 51 and the lower mold member 52 closely contact the transparent lids 20 and the silicon wafer 10 by the vacuum absorbed buffer layer 53, and thereby a mold cavity is formed (referring to FIG. 6B as well). The encapsulation compound 60 is then injected into the mold cavity, so that the encapsulation compound 60 covers the circumference of each said transparent lid 20 but does not cover the entire third surface 26 of each transparent lid 20 (as shown in FIG. 6B), or the encapsulation compound 60 covers edges of the third surfaces 26 (as shown in FIG. 6C), as long as the photosensitive area 12 is not covered.

The mold 50 is pressurized to transform the encapsulation compound 60, and the mold 50 is open before a post-mold baking process is carried out for curing the encapsulation compound 60. What is illustrated in FIG. 7A and FIG. 7B is the image sensor packaging structure made with the mold 50 of FIG. 6B and through the post-mold baking process, which is to be further cut. From the sectional view of FIG. 7B, it is clear that the encapsulation compound 60 covers the circumference of the transparent lids 20 but leaves the third surface 26 exposed.

On the other hand, FIG. 8A and FIG. 8B depict the image sensor packaging structure made with the mold 50 of FIG. 6C and through the post-mold baking process, which is to be further cut. Therein, the encapsulation compound 60 covers the edges of each said third surface 26, so the transparent lids 20 shown in FIG. 8A are relatively small in area.

Figure 9:
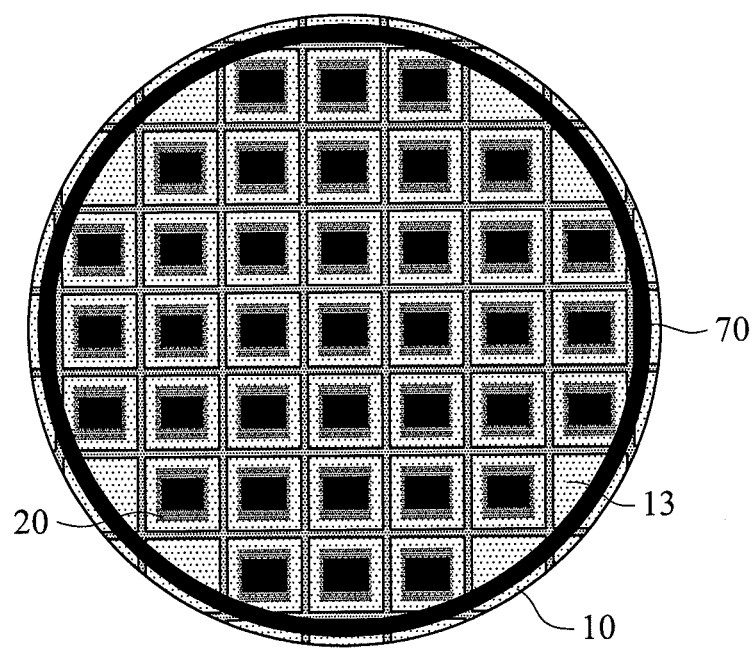
FIG. 9 is a top schematic view of a silicon wafer with a dam according to one embodiment of the present invention.

In addition, please refer to FIG. 9 and FIG. 10A, the dispensing packaging process may implement a dam 70 provided at the periphery of the first surface 13 of the silicon wafer 10, so as to form a circular structure enclosing the silicon wafer 10 and in turn the image sensor chips 11 with the transparent lids 20. The dam 70 may be made of epoxy resin, while the height of the dam 70 is equal to or smaller than the overall height of the image sensor packaging structure composed of the transparent lids 20 and the image sensor chip 11.

Referring to FIG. 10B, the technique of dispensing is used to apply the encapsulation compound 60 onto the first surface 13 so that the encapsulation compound 60 is filled between the dam 70 and the transparent lids 20 to the full while the encapsulation compound 60 is used to the extent that the height thereof is not greater than that of the transparent lid 20. Therefore, it can ensure that the encapsulation compound 60 covers the circumference of the transparent lids 20 without covering the third surfaces 26 of the transparent lids 20 (as shown in FIG. 10B). The encapsulation compound 60 adopted is a liquid compound.

Figure 11:
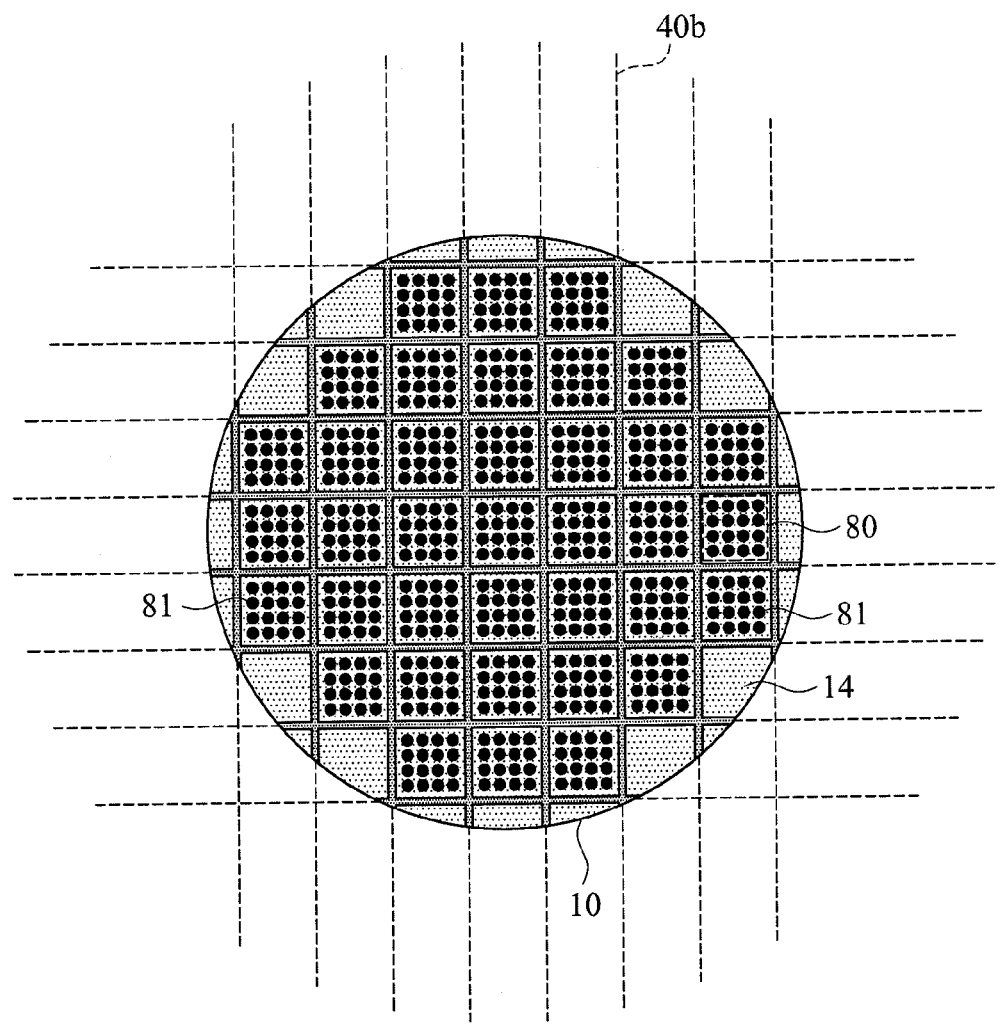
FIG. 11 is a schematic view of a silicon wafer with a ball grid array according to one embodiment of the present invention.

As shown in FIG. 11, after the packaging process, the silicon wafer 10 is overturned in order to place solder balls 81 on the second surface 14. The solder balls 81 are in fact placed on solder ball pads 30 and arrayed as a ball grid array 80, so that the image sensor chip 11 is electrically connected to an external device (such as a circuit substrate) by way of the first contacts 16, the conducting channel 18, the solder ball pads 30 and the solder balls 81. At last, by dicing the silicon wafer 10 along the cutting lines 40b, a plurality of image sensor package structures can be obtained.

The separate image sensor packaging structure may be any one depicted in FIG. 12A, FIG. 12B, FIG. 13A, FIG. 13B, FIG. 14A and FIG. 14B. To sum up, the image sensor packaging structure made through the manufacturing method may be as the six shown embodiments.

Therein, the wafer level image sensor packaging structure comprises an image sensor chip 11, a transparent lid 20, and an encapsulation compound 60.

The image sensor chip 11 has a first surface 13 and a second surface 14, which are respectively the upper surface and the lower surface of the image sensor chip 11. The first surface 13 is provided with a plurality of photosensitive elements 15, which are arranged into an array in the photosensitive area 12 on the first surface 13, for sensing light.

The first surface 13 is provided with a plurality of first contacts 16, which surround outside the photosensitive area 12 and are electrically connected to the photosensitive elements 15 through the inner circuit configuration of the image sensor chip 11.

The image sensor chip 11 comprises a plurality of conducting channels 18, and each conducting channel passes through the image sensor chip 11. The conducting channel 18 has one end electrically connected to the first contacts 16, and the other end electrically connected to the solder ball pads 30 on the second surface 14, thus acting as a channel that electrically connects the photosensitive elements 15 to the exterior.

On the second surface 14 of the image sensor chip 11, there may further be solder balls 81, which are electrically connected to the solder ball pads 30 and form a ball grid array 80 on the second surface 14 (seeing FIG. 11 as well). The solder balls 81 are not only electrically connected to solder ball pads 30, but also electrically connected to the conducting channel 18 through the solder ball pads 30, thus acting as an interface that electrically connects the photosensitive elements 15 to the exterior.

As shown in FIG. 12A, FIG. 13A and FIG. 14A, the transparent lid 20 is positioned over the photosensitive area 12 and adhered to the first surface 13 such that an air chamber 17 is defined between the transparent lid 20 and the image sensor chip 11.

Figure 12B:
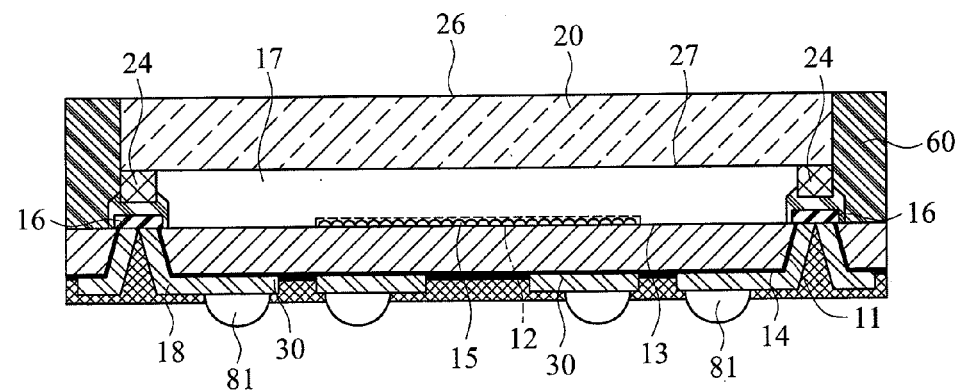
Figure 13B:
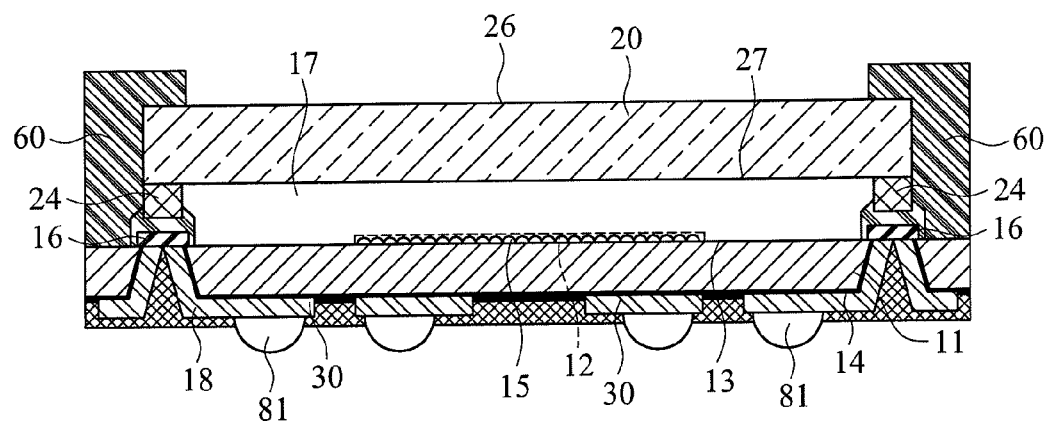
Figure 14B:
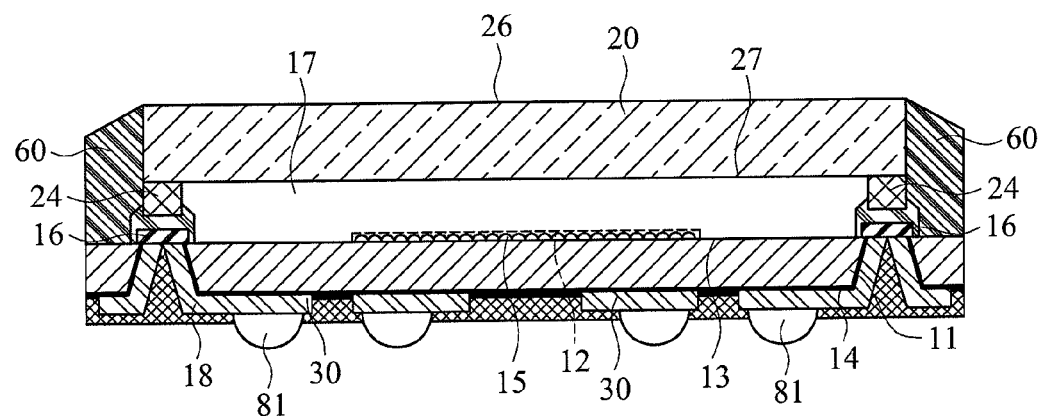

Referring to FIG. 12B, FIG. 13B and FIG. 14B, the transparent lid 20 has a third surface 26 and a fourth surface 27. A supporting frame 24 may be further provided at edges of the fourth surface 27, so that the transparent lid 20 is adhered to the first surface 13 via the supporting frame 24 while the supporting frame 24 surrounds the exterior of the photosensitive area 12. Therein, the supporting frame 24 may be made of a resin material or a plastic material.

As shown in FIG. 12A, FIG. 12B, FIG. 14A and FIG. 14B, the encapsulation compound 60 is arranged on the first surface 13 and covers the circumference of the transparent lid 20 and the supporting frame 24 (as shown in FIG. 12B, FIG. 13B and FIG. 14B). In addition, the encapsulation compound 60 may be of an opaque material, so as to prevent light from entering the sides of the transparent lid 20, thereby reducing noise caused by stray light. Furthermore, as shown in FIG. 13A and FIG. 13B, the encapsulation compound 60 may further extend to cover the edges of the third surface 26 of the transparent lid 20, without covering the photosensitive area 12, so as to further shade the lateral of the transparent lid 20 from incoming light. The encapsulation compound 60 may be a mold compound or a liquid compound.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A manufacturing method for a wafer level image sensor packaging structure, comprising steps of:
   providing a silicon wafer, which has a plurality of image sensor chips, wherein each said image sensor chip has a photosensitive area;
   providing a plurality of transparent lids;
   allotting one said transparent lid over the photosensitive area of a respective said image sensor chip; and
   carrying out a packaging process by arranging an encapsulation compound on a first surface of the silicon wafer so that the encapsulation compound covers circumferences of the transparent lids;
   wherein the step of carrying out the packaging process comprises steps of:
   providing a dam at a periphery of the first surface to form a circular structure; and
   applying the encapsulation compound, which is a liquid compound, into the dam, so that the encapsulation compound covers the circumferences of the transparent lids, but does not cover a top surface of any said transparent lid.

2. The manufacturing method of claim 1, wherein the silicon wafer is a TSV (Through-Silicon Vias) wafer and the TSV wafer has a second surface on which a re-distribution layer is formed and a plurality of solder ball pads is provided.

3. The manufacturing method of claim 1, wherein the transparent lids are cut from a transparent panel.

4. The manufacturing method of claim 1, wherein the transparent lids are obtained by cutting a transparent panel, which has been provided with a plurality of bank-shaped frames thereon, along cutting lines formed on the bank-shaped frames, so that each said transparent lid has edgewise a supporting frame; and the transparent lid is adhered to the image sensor chip via the supporting frame, so that the supporting frame surrounds outside the photosensitive area.

5. The manufacturing method of claim 4, wherein the bank-shaped frames are formed through a screen printing process, a transfer molding process or an injection molding process.

6. The manufacturing method of claim 1, following the step of carrying out the packaging process, further comprising steps of:
   placing solder balls on a second surface of the silicon wafer; and
   dicing the silicon wafer to form a plurality of image sensor packaging structures.

7. A manufacturing method for a wafer level image sensor packaging structure, comprising steps of:
   providing a silicon wafer, which has a plurality of image sensor chips, wherein each said image sensor chip has a photosensitive area;
   providing a plurality of transparent lids;
   allotting one said transparent lid over the photosensitive area of a respective said image sensor chip; and
   carrying out a packaging process by arranging an encapsulation compound on a first surface of the silicon wafer so that the encapsulation compound covers circumferences of the transparent lids;
   wherein the step of carrying out the packaging process comprises steps of:
   placing the silicon wafer with the transparent lids into a mold;
   injecting the encapsulation compound, which is a mold compound, into a cavity of the mold, so that the encapsulation compound covers edges of the transparent lids but does not entirely cover a top surface of each said transparent lid; and
   transforming the encapsulation compound and carrying out a post-mold baking process for curing the encapsulation compound.

8. The manufacturing method of claim 7, wherein the silicon wafer is a TSV (Through-Silicon Vias) wafer and the TSV wafer has a second surface on which a re-distribution layer is formed and a plurality of solder ball pads is provided.

9. The manufacturing method of claim 7, wherein the transparent lids are cut from a transparent panel.

10. The manufacturing method of claim 7, wherein the transparent lids are obtained by cutting a transparent panel, which has been provided with a plurality of bank-shaped frames thereon, along cutting lines formed on the bank-shaped frames, so that each said transparent lid has edgewise a supporting frame; and the transparent lid is adhered to the image sensor chip via the supporting frame, so that the supporting frame surrounds outside the photosensitive area.

11. The manufacturing method of claim 10, wherein the bank-shaped frames are formed through a screen printing process, a transfer molding process or an injection molding process.

12. The manufacturing method of claim 7, wherein the mold comprises an upper mold member and a lower mold member, the upper mold member abutting against the top surface of each said transparent lids and the lower mold member abutting against a second surface of the silicon wafer.

13. The manufacturing method of claim 12, wherein the upper mold member has a vacuum absorbed buffer layer for abutting against the top surface of each said transparent lids.

14. The manufacturing method of claim 7, wherein the mold comprises an upper mold member and a lower mold member, the upper mold member having a plurality of bulges, each said bulge abutting against a center portion of the top surface of a respective said transparent lid, and the lower mold member abutting against a second surface of the silicon wafer.

15. The manufacturing method of claim 14, wherein the upper mold member has a vacuum absorbed buffer layer for abutting against the top surface of each said transparent lids.

16. The manufacturing method of claim 7, following the step of carrying out the packaging process, further comprising steps of:
   placing solder balls on a second surface of the silicon wafer; and
   dicing the silicon wafer to form a plurality of image sensor packaging structures.

* * * * *